United States Patent

Matsuura

[11] Patent Number: 6,124,641
[45] Date of Patent: Sep. 26, 2000

[54] SEMICONDUCTOR DEVICE ORGANIC INSULATOR FILM

[75] Inventor: Masazumi Matsuura, Tokyo, Japan

[73] Assignee: Mitsubishi Denki Kabushiki Kaisha, Tokyo, Japan

[21] Appl. No.: 08/987,099

[22] Filed: Dec. 8, 1997

[30] Foreign Application Priority Data

Jun. 26, 1997 [JP] Japan ................................ 9-169858

[51] Int. Cl.[7] ................................................ H01L 23/532
[52] U.S. Cl. ...................... 257/759; 438/623; 438/780; 438/790
[58] Field of Search ............................ 257/759; 438/623, 438/780, 793, 794, 790

[56] References Cited

U.S. PATENT DOCUMENTS 5,656,555   8/1997   Cho ........................................ 438/760

OTHER PUBLICATIONS

"Low Dielectric Constant Flowfill Technology for IMD Applications" Feb. 10–11, 1997 DUMIC Conference 1997 ISMIC pp. 34–40.

"Novel Self–planarizing CVD Oxide for Interlayer Dielectric Applications" IEDM 1994 pp. 117–120.

"A New Methylsilsesquioxane Spin–on–Polymer" Proceedings of the 48th Symposium on Semiconductors and Integrated Circuits Technology (1995) pp. 18–23.

"New Reflowable Organic Spin–On Glass for Advanced Gap–Filling and Planarization" Jun. 7–8, 1994 VMIC Conference 1994 ISMIC pp. 186–192.

*Primary Examiner*—John Guay
*Attorney, Agent, or Firm*—McDermott, Will & Emery

[57] ABSTRACT

An interlayer insulating film of a semiconductor device is made of a material in which silicon atoms are main elements, and each of the silicon atoms has an oxygen bond and a carbon bond, and further at least some of the silicon atoms have a hydrogen bond. The interlayer insulating film is formed by chemical vapor deposition employing a mixed gas of hydrogen peroxide and a reactive gas having a gas molecular structure in which silicon atoms have a hydrogen bond and a carbon bond.

7 Claims, 8 Drawing Sheets

R=(CH₃)

R=(C₂H₅)

R=(CH=CH₂)

R=(CH3)

R=(CH3)

R=(C2H5)

R=(C2H5)

R=(CH=CH2)

R=(CH3)

SEMICONDUCTOR DEVICE ORGANIC INSULATOR FILM

TECHNICAL FIELD

The present invention relates to a semiconductor device and a manufacturing method thereof and, more specifically, to a structure of an interlayer insulating film and a method for forming the structure.

BACKGROUND ART

As for an interlayer insulating film of a semiconductor device, a silicon oxide film formed by a chemical vapor deposition (CVD) by using a silicon compound, such as a silane gas ($SiH_4$) and hydrogen peroxide ($H_2O_2$), has a high flowability and can fill in very fine spaces of less than 0.25 ($\mu$m between conducting lines. Further, the silicon oxide film formed by the above method exhibits a self-planarization effect. Due to these advantages, the above method is increasingly being used as a method for planarization of interlayer insulating film of a next-generation to replace the conventional methods such as a spin on glass method (SOG). For details, refer to, for instance, "Novel Self-planarizing CVD Oxide for Interlayer Dielectric Applications," Technical Digest of IEDM '94.

According to the above method, a silicon oxide film is formed by a process that is expressed by the chemical formulae shown below. First, silanol ($Si(OH)_4$) is formed by an oxidizing reaction involving silane gas ($SiH_4$) and hydrogen peroxide ($H_2O_2$) (see chemical formulae (1-1) to (1-3)). Then, a silicon oxide ($SiO_2$) is produced from silanol by hydrolysis or a dehydropolymerization reaction with application of thermal energy (see chemical formula (2)). A silicon oxide film is formed when the above reactions are effected on a substrate.

$$SiH_4 + 2H_2O_2 \rightarrow Si(OH)_4 + 2H_2 \qquad (1\text{-}1)$$

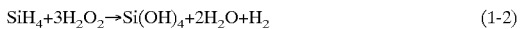
$$SiH_4 + 3H_2O_2 \rightarrow Si(OH)_4 + 2H_2O + H_2 \qquad (1\text{-}2)$$

$$SiH_4 + 4H_2O_2 \rightarrow Si(OH)_4 + 4H_2O \qquad (1\text{-}3)$$

$$nSi(OH)_4 \rightarrow nSiO_2 + 2nH_2O \qquad (2)$$

FIG. 7(a)–FIG. 7(c) schematically show a conventional flow for forming an interlayer insulating film according to the above method. This flow will be described below with reference to FIG. 7(a)–FIG. 7(c).

Referring to FIG. 7(a), reference numeral 1 denotes a semiconductor device substrate including a silicon substrate, a device, and an insulating film formed thereon (not separately shown). Aluminum interconnections 2 are formed on the substrate 1.

An interlayer insulating film is formed in the following manner. A first plasma oxide film 3 is formed on the substrate 1 on which the aluminum interconnections 2 have been formed. Then, a silicon oxide film 4a is formed so as to cover the first plasma oxide film 3 by the above-described CVD method using a silane gas ($SiH_4$) and hydrogen peroxide ($H_2O_2$). Finally, a second plasma oxide film 5 is formed so as to cover the entire structure, to thereby form a flat interlayer insulating film.

A silicon oxide film, formed by the CVD method using a silane gas ($SiH_4$) and hydrogen peroxide ($H_2O_2$), can fill in very fine spaces between conducting lines and achieves superior self-planarization, because the silanol that is produced during the film formation process exhibits superior flowability.

A silicon oxide produced through the formation of silanol in the above manner has a relative dielectric constant of 4.0–5.0. With recent miniaturization of devices, the delay of the conducting lines due to the capacitance of an interlayer insulating film is becoming a more serious problem. Therefore, for the future processes to form an interlayer insulating film, a reduction in capacitance is an important objective. In particular, it is important to reduce the capacitance of fine spaces of less than 0.3 $\mu$m between conducting lines. For this purpose, an interlayer insulating film is needed which has a small relative dielectric constant and which is superior in embeddability and planarization characteristics.

An organic spin-on-glass (SOG) film containing a methyl radical is known as a conventional film that satisfies the above requirements. The molecular structure of this material is shown in FIG. 8. The Si—O network is divided by terminating one bond of some silicon atoms by a methyl radical, whereby the film density is lowered and, in turn, the relative dielectric constant is reduced. For details, refer to, for instance, "A New Methylsilsesquioxane Spin-on-Polymer," Proceedings of The 48th Symposium on Semiconductors and Integrated Circuits Technology and "New Reflowable Organic Spin-on-Glass for Advanced Gap-filling and Planarization," Proceedings of VMIC Conference 1994.

To reduce the dielectric constant with this material, however, it is necessary to mix a large amount of methyl radicals. This causes a problem of a reliability-related failure called "poisoned via."

FIG. 9 illustrates a mechanism of occurrence of a poisoned via failure. In FIG. 9, reference numeral 1 denotes a substrate on which a device and a first plasma oxide film 3 are formed; 2, a lower-layer aluminum conducting line; 3, a first plasma oxide film; 4a, an organic SOG film; 5, a second plasma oxide film; 6, a titanium nitride/titanium film; 7, a tungsten film; 8, a layer denatured by oxygen plasma; 9, water migrated from the via side wall; and 10, an interstice (poisoned via).

The poisoned via is a failure that occurs in the connection hole (via) 10 for connecting the upper and lower conducting layers. The poisoned via is generated when a portion of the organic SOG film 4a exposed at the via side wall is bombarded with oxygen plasma, during resist removal after opening of the via, and is, thereby denatured. That is, Si—$CH_3$ radicals are changed to Si—OH radicals by the oxygen plasma, leading to easy entrance of water from the external air. The water introduced from the external air is emitted through the side wall when the via is charged with the tungsten film 7, for instance by CVD, and thereby prevents growth of the tungsten film 7 in the via 10. As a result, the resistivity increases or a disconnection occurs in the via 10, and the reliability of the conducting line is reduced remarkably.

SUMMARY OF THE INVENTION

An object of the present invention is to solve the above problems of the conventional method. More specifically, an object of the invention is to reduce the relative dielectric constant of a silicon oxide film formed by a CVD method using organic silane, such as methylsilane and hydrogen peroxide ($H_2O_2$), and realize superior embeddability, while preventing a poisoned via from being formed in a resulting insulating film.

According to one aspect of the present invention, a semiconductor device comprises an interlayer insulating film that is made of a material having silicon atoms as main elements, and substantially each of said silicon atoms having at least an oxygen bond and a carbon bond, and further at least some of the silicon atoms have a hydrogen bond.

In another aspect of the present invention, the carbon bond is a bond with either a methyl radical, an ethyl radical, or a vinyl radical.

According to another aspect of the present invention, in a manufacturing method of a semiconductor device, an interlayer insulating film is formed by chemical vapor deposition by using a mixed gas of hydrogen peroxide and a reactive gas having a gas molecular structure in which each silicon atom has at least a hydrogen bond and a carbon bond, and thereby the resultant interlayer insulating film has silicon atoms as main elements, and substantially each of the silicon atoms has at least an oxygen bond and a carbon bond, and further at least some of the silicon atoms has a hydrogen bond.

In another aspect of the present invention, in the manufacturing method of a semiconductor device, an organic silane is used as the reactive gas.

In another aspect of the present invention, in the manufacturing method of a semiconductor device, the organic silane is selected from a group of methyl silane, ethylsilane, and vinylsilane or a mixture of either methyl silane, ethylsilane, or vinylsilane.

Other and further objects, features and advantages of the invention will appear more fully from the following description.

BRIEF DESCRIPTION OF THE DRAWINGS

Some embodiments of the present invention will be hereinafter described with reference to the accompanying drawings. The same reference numerals in the drawings denote the same or corresponding parts.

BEST MODE FOR CARRYING OUT THE INVENTION

First Embodiment

Figure 1A:
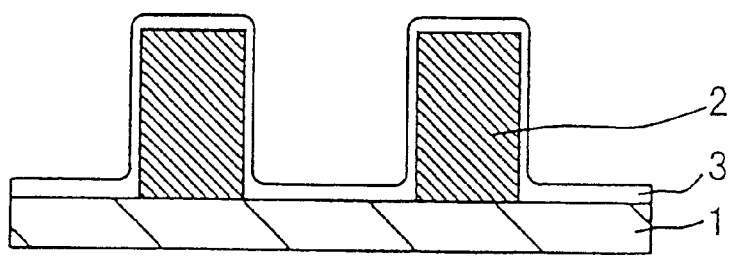
FIG. 1(a)–FIG. 1(c) are sectional views showing a method of manufacturing a semiconductor device, in particular, a method of forming an interlayer insulating film, according to a first embodiment of the present invention.
Figure 1B:
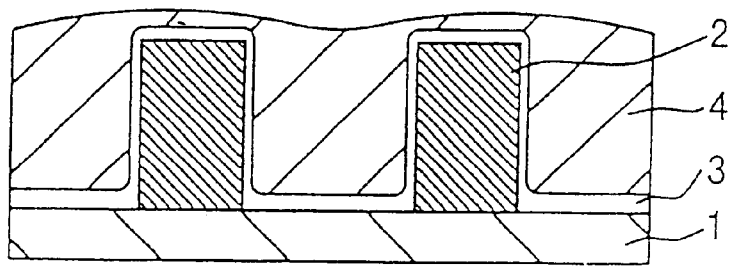
Figure 1C:
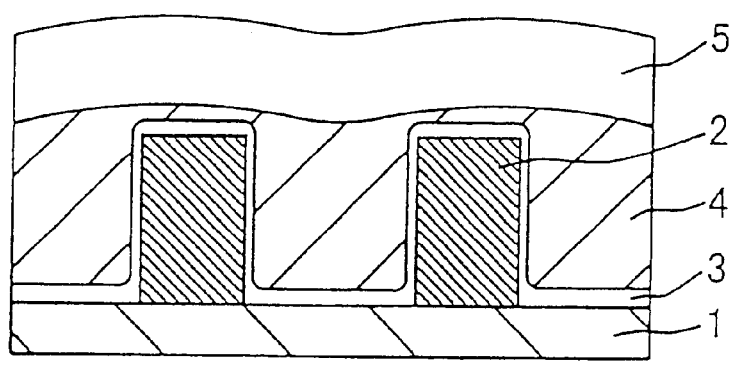

FIG. 1(a)–FIG. 1(c) are sectional views showing respective steps of a flow of method of manufacturing a semiconductor device, and in particular, a method for forming an interlayer insulating film, according to a first embodiment of the invention.

The manufacturing method, and in particular, the process for forming an interlayer insulating film, is described below with reference to FIG. 1(a)–FIG. 1(c).

Referring to FIG. 1(a), reference numeral 1 denotes a semiconductor device substrate including a silicon substrate, a device and an insulating layer formed thereon, although not shown explicitly. Aluminum interconnections 2 are formed on the substrate 1.

The interlayer insulating film is formed by initially forming a first plasma oxide film 3 on substrate 1 having the aluminum interconnections 2. Oxide film 3 is formed by plasma CVD, typically at a formation temperature of about 300° C., pressure of about 700 mTorr (9.13 Pa), and high-frequency power of about 500 W. Source gases are silane ($SiH_4$) and nitrous oxide ($N_2O$). The resulting oxide film 3 has a thickness of about 1,000 Å.

The plasma oxide film 3 may be formed by another type of plasma CVD using source gases comprising TEOS (tetraethoxyorthosilicate) and oxygen, typically at a formation temperature of about 400° C., pressure of about 5 Torr (665 Pa), and high-frequency power of about 500 W.

As shown in FIG. 1(b), silicon oxide film 4 (hereinafter abbreviated as "HMO film" where appropriate) is formed on the first plasma oxide film 3 by a CVD method using methylsilane ($SiH_3CH_3$) and hydrogen peroxide ($H_2O_2$).

Then, as shown in FIG. 1(c), a second plasma oxide film 5 is formed on the CVD-formed silicon oxide film 4. The second plasma oxide film 5 can be formed either under the same or different conditions as the first plasma oxide film 3.

Although not shown in FIG. 1(c), the inventive method of manufacturing a semiconductor device further includes formation of second aluminum layers on the second plasma oxide film 5, as well as connection holes for connecting lower and upper conducting layers. The semiconductor device is completed after execution of other necessary processes.

This embodiment is characterized by the molecular structure and the forming method of forming the CVD-formed silicon oxide film (HMO film) 4. The methylsilane, as used above, is monomethylsilane ($SiH_3CH_3$). Typical forming conditions of the HMO film are, for example, as follows:

Formation temperature: 1° C.

Formation pressure: 1,000 mTorr (133 Pa)

Gas flow rates: $SiH_3CH_3$ 80 SCCM $H_2O_2$ 0.65 g/min

Ranges of conditions that allow formation of a HMO film are, for example, as follows:

Formation temperature: −20° to 20° C.

Formation pressure: 500 to 2,000 mTorr (66.5 to 226 Pa)

Gas flow rates: $SiH_3CH_3$ 40 to 200 SCCM $H_2O_2$ 0.4 to 0.9 g/min

It is considered that under the above conditions the film formation proceeds according to the following chemical reaction formulae:

$$SiH_3CH_3 + H_2O_2 \rightarrow SiH_2(OH)CH_3 + H_2O \qquad (3\text{-}1)$$

$$SiH_3CH_3 + 2H_2O_2 \rightarrow SiH(OH)_2CH_3 + 2H_2O \qquad (3\text{-}2)$$

$$SiH_3CH_3 + 3H_2O_2 \rightarrow Si(OH)_3CH_3 + 3H_2O \qquad (3\text{-}3)$$

$$n\text{SiH(OH)}_2\text{CH}_3 \rightarrow n\text{SiOH(CH}_3) + n\text{H}_2\text{O} \tag{4}$$

In the above chemical reactions, first, intermediates including an Si—OH bond, i.e., $\text{SiH}_2\text{(OH)CH}_3$, $\text{SiH(OH)}_2\text{CH}_3$, $\text{Si(OH)}_3\text{CH}_3$, are produced by the reactions between monomethylsilane $(\text{SiH}_3\text{CH}_3)$ and hydrogen peroxide $(\text{H}_2\text{O}_2)$ (see chemical formulae (3-1) to (3-3)).

A Si—O network is thereafter grown by dehydrocondensation involving Si—OH radicals in the intermediates. The intermediate contributing to this process is mainly the one produced according to the chemical formula (3-2), and the reaction proceeds according to chemical formula (4). The intermediate produced according to chemical formula (3-1) contributes to the reaction in terminating the Si—O network. The intermediate formed according to chemical formula (3-3) also contributes to the film formation, though the probability of occurrence is low.

Figure 2:
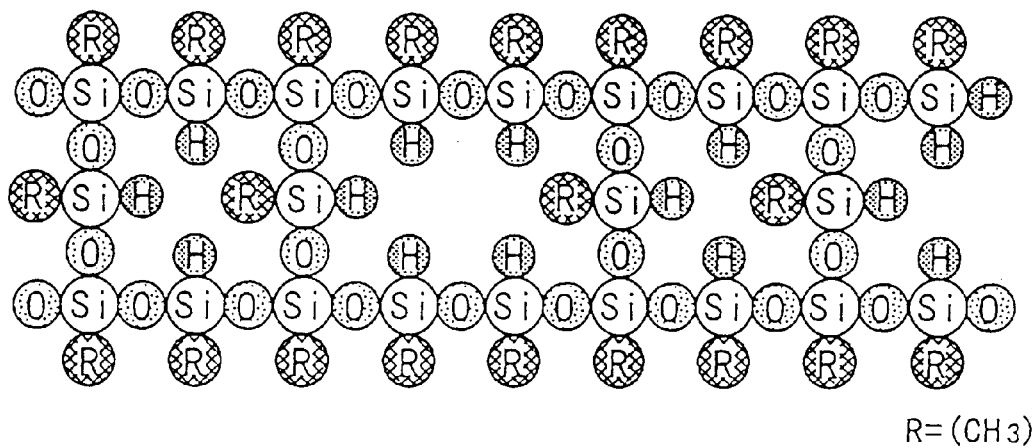
FIG. 2 schematically shows the molecular structure of a silicon oxide film formed according to the first embodiment of the invention by using methylsilane as a reactant gas.

FIG. 2 schematically shows the molecular structure of a silicon oxide film formed under the above conditions. This interlayer insulating film, in which silicon atoms are main elements, is formed such that each silicon atom has an oxygen bond and a carbon bond, and that at least some of the silicon atoms have a hydrogen bond. The carbon bond is a bond with a methyl radical.

Figure 8:
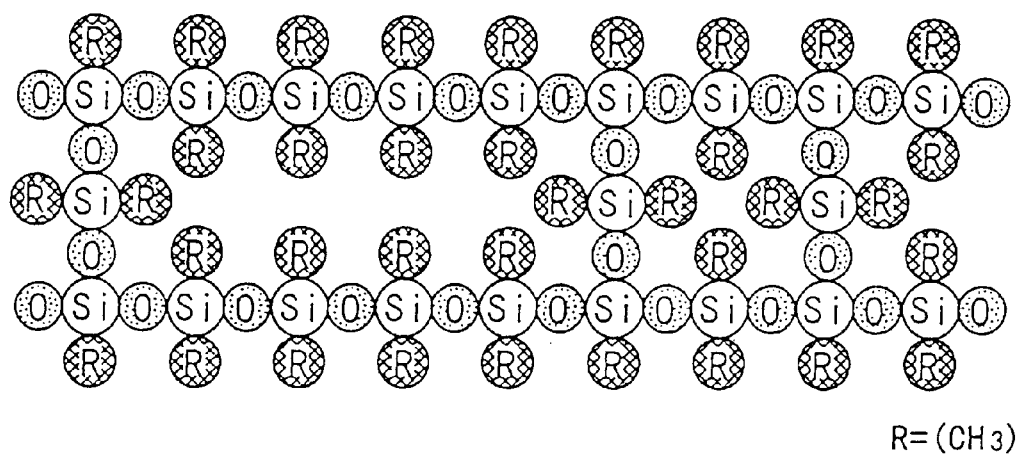
FIG. 8 schematically shows the molecular structure of a conventional organic SOG film.
Figure 9:
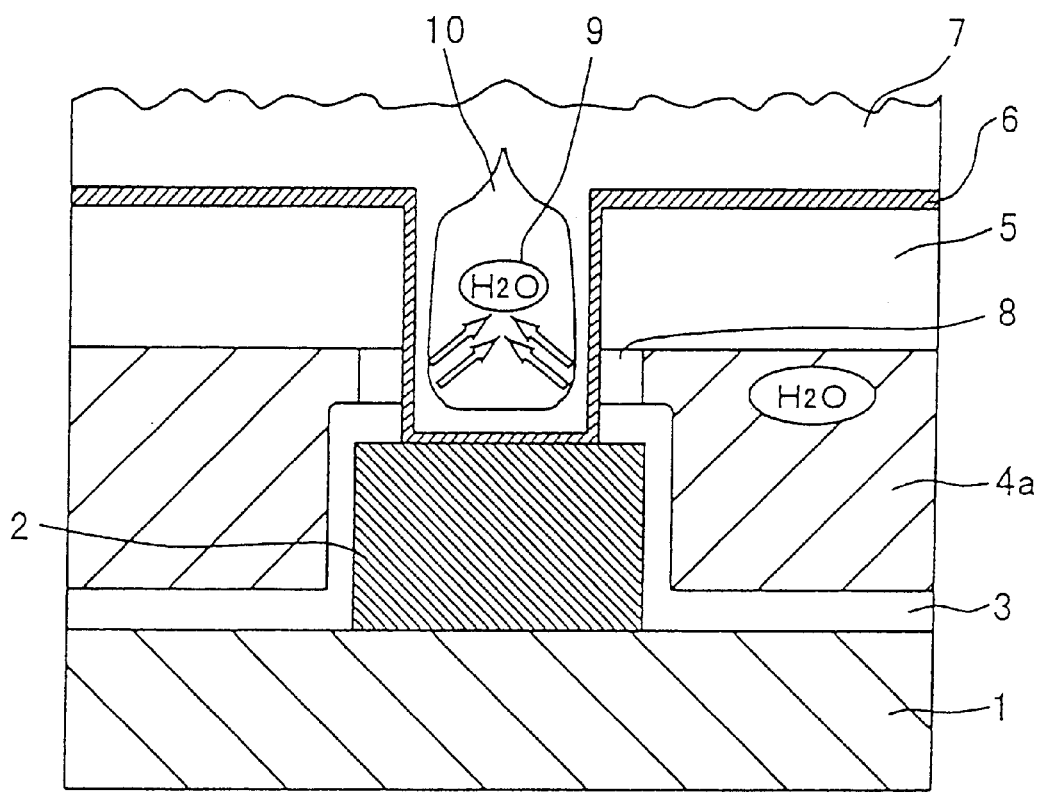
FIG. 9 schematically illustrates a mechanism of poisoned via failure.

As shown in FIG. 8, a conventional SOG film comprises Si—O bonds and Si—CH$_3$ bonds. In contrast, the HMO film according to the invention comprises Si—O bonds, Si—CH$_3$ bonds, and Si—H bonds.

In this embodiment, the molecular structure includes Si—H bonds which are absent from the conventional film. This means that part of Si—CH$_3$ bonds in the organic SOG film are replaced by Si—H bonds. Therefore, a reduction in density equivalent to that in the conventional case can be obtained even with a smaller amount of Si—CH$_3$ bonds. That is, the dielectric constant can be reduced as much as in the conventional case even with Si—CH$_3$ bonds mixed at a low concentration.

In the following, the degassing characteristic of the HMO film of the invention will be compared with that of a conventional organic SOG film.

Figure 3A:
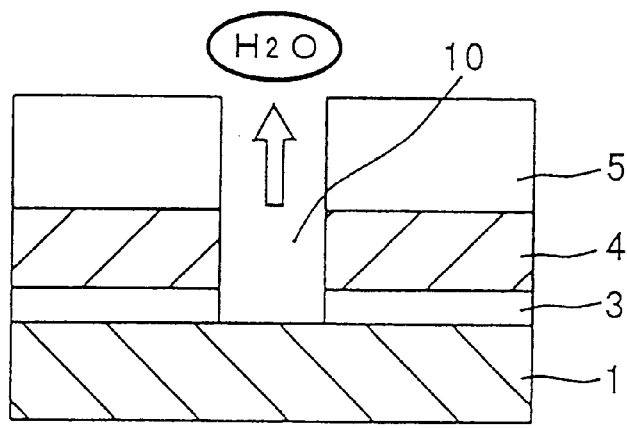
FIG. 3(a) shows the structure of a sample that was used for a high-temperature extracted gas analysis to measure the amount of water extracted from a silicon oxide film of the invention and a conventional organic SOG film.

FIG. 3(a) shows the structure of a sample that was used to measure the amount of water extracted from an HMO film or an organic SOG film. As shown in FIG. 3(a), the sample is configured such that a first plasma oxide film 3, a silicon oxide film of the invention or a conventional silicon oxide film 4, and a second plasma oxide film 5 are laminated on a semiconductor substrate 1, and a connection hole (via) 10 is formed.

By using samples so configured, the amount of water extracted from the portion of an HMO film or an organic SOG film that was exposed at the side wall of the via 6 was measured by high-temperature gas analysis. With the sample structure of FIG. 3(a), the via side wall is bombarded with oxygen plasma when a resist is removed after the via 10 is actually formed.

Figure 3B:
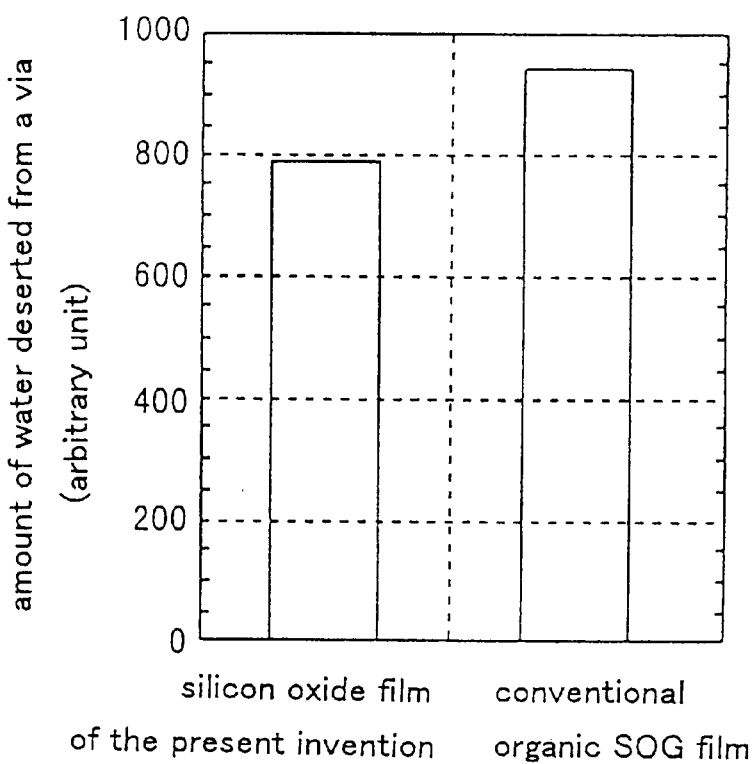
FIG. 3(b) is a graph showing a result of measurement of the amount of water extracted.

FIG. 3(b) shows degassing characteristics of the HMO film of the invention and the conventional SOG film. It is clearly seen from FIG. 3(b) that the amount of water extracted from the HMO film of the present invention is smaller than that extracted from the SOG film. This is believed to result from the lower amount of Si—CH$_3$ bonds in the HMO film of the present invention vis-a-vis the SOG film.

It is understood from the above description that the HMO film of the present invention exhibits a relatively small dielectric constant equivalent to that of a conventional SOG film, while avoiding a poisoned via failure that is a problem of the conventional method, thereby providing a highly reliable interlayer insulating film structure.

In the above embodiment, the HMO film is formed on the first plasma oxide film 3; however, it may be formed directly on the aluminum interconnections 2.

Second Embodiment

While in the first embodiment monomethylsilane $(\text{SiH}_3\text{CH}_3)$ is used as methylsilane, in the second embodiment monomethylsilane and dimethylsilane $(\text{SiH}_2(\text{CH}_3)_2)$ are used in mixed form. In this case, the following chemical reaction formulae (5-1) and (5-2) are added to the above-mentioned formulae (3-1), (3-2), and (4):

$$\text{SiH}_2(\text{CH}_3)_2 + \text{H}_2\text{O}_2 \rightarrow \text{SiH(OH)(CH}_3)_2 + \text{H}_2\text{O} \tag{5-1}$$

$$\text{SiH}_2(\text{CH}_3)_2 + 2\text{H}_2\text{O}_2 \rightarrow \text{Si(OH)}_2(\text{CH}_3)_2 + 2\text{H}_2\text{O} \tag{5-2}$$

The intermediate produced according to chemical formula (5-1) contributes only to the reaction for terminating a Si—O network, like the intermediate produced according to chemical formula (3-1). The intermediate produced according to chemical formula (5-2) also contributes to the film formation, though the probability of occurrence is low.

Figure 4:
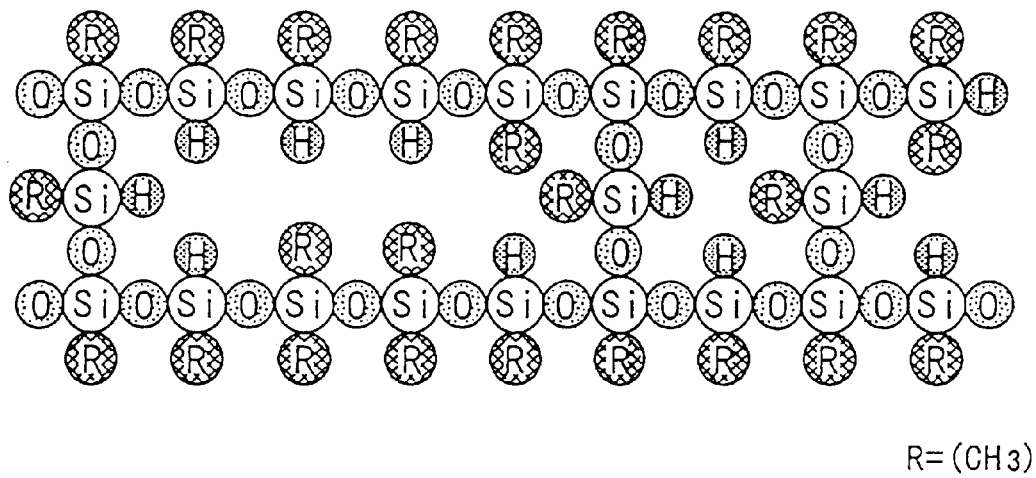
FIG. 4 schematically shows the molecular structure of a silicon oxide film formed according to a second embodiment of the invention employing a source gas mixture of monomethylsilane and dimethylsilane.

FIG. 4 shows the molecular structure of a silicon oxide film formed according to this embodiment, which is basically the same as that of FIG. 2 except that the number of methyl radicals is somewhat increased at terminal portions of the Si—O network.

In this embodiment, the HMO film also comprises Si—O bonds, Si—CH3 bonds, and Si—H bonds. As in the case of the first embodiment, the molecular structure includes Si—H bonds which are absent in conventional films. This means that part of the Si—CH$_3$ bonds in the organic SOG film are replaced by Si—H bonds. Therefore, a reduction in density equivalent to that in the conventional case can be obtained even with a smaller content Of Si—CH$_3$ bonds. That is, the dielectric constant can be reduced as much as in the conventional case even with Si—CH$_3$ bonds mixed at a low concentration.

Third Embodiment

While in the first embodiment methylsilane is used as a reactive gas, in the third embodiment, ethylsilane (monoethylsilane $(\text{SiH}_3(\text{C}_2\text{H}_5))$, or a mixture of monoethylsilane and diethylsilane $(\text{SiH}_2(\text{C}_2\text{H}_5)_2))$ is used.

Where only monoethylsilane is used, a silicon oxide film can be formed by reactions similar to those according to chemical formulae (3-1) to (3-3) and (4). In this case, chemical reaction formulae are as follows:

$$\text{SiH}_3\text{C}_2\text{H}_5 + \text{H}_2\text{O}_2 \rightarrow \text{SiH}_2(\text{OH})\text{C}_2\text{H}_5 + \text{H}_2\text{O} \tag{6-1}$$

$$\text{SiH}_3\text{C}_2\text{H}_5 + 2\text{H}_2\text{O}_2 \rightarrow \text{SiH(OH)}_2\text{C}_2\text{H}_5 + 2\text{H}_2\text{O} \tag{6-2}$$

$$\text{SiH}_3\text{C}_2\text{H}_5 + 3\text{H}_2\text{O}_2 \rightarrow \text{Si(OH)}_3\text{C}_2\text{H}_5 + 3\text{H}_2\text{O} \tag{6-3}$$

$$n\text{SiH(OH)}_2\text{C}_2\text{H}_5 \rightarrow n\text{SiOH(C}_2\text{H}_5) + n\text{H}_2\text{O} \tag{7}$$

Where both monoethylsilane and diethylsilane are used in mixed form, the following chemical formulae (8-1) and (8-2) are added to the above chemical formulae (6-1) to (6-3) and (7):

$$\text{SiH}_2(\text{C}_2\text{H}_5)_2 + \text{H}_2\text{O}_2 \rightarrow \text{SiH(OH)(C}_2\text{H}_5)_2 + \text{H}_2\text{O} \tag{8-1}$$

$$\text{SiH}_2(\text{C}_2\text{H}_5)_2 + 2\text{H}_2\text{O}_2 \rightarrow \text{Si(OH)}_2(\text{C}_2\text{H}_5)_2 + 2\text{H}_2\text{O} \tag{8-2}$$

Figure 5A:
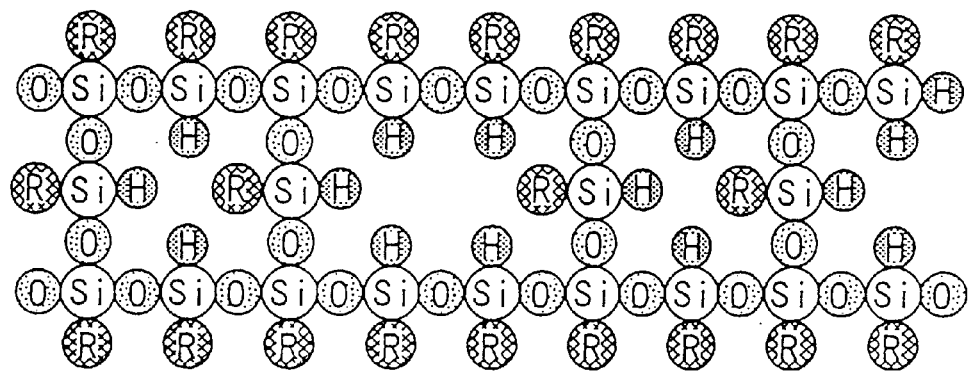
FIGS. 5(a) and 5(b) schematically show the molecular structures of silicon oxide films formed according to a third embodiment of the invention in which monoethylsilane is singly used as a source gas and a source gas mixture of monoethylsilane and diethylsilane are used, respectively.
Figure 5B:
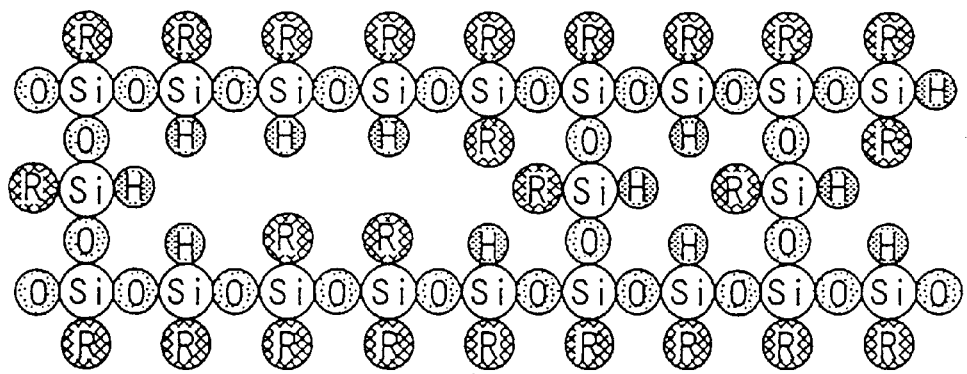

FIG. 5(a) and FIG. 5(b) show the molecular structures of silicon oxide films according to this embodiment, in which a monoethylsilane gas is used and a mixed gas of monoethylsilane and diethylsilane is used, respectively.

A comparison between the molecular structures of FIG. 5(a) and FIG. 2 and the molecular structures of FIG. 5(b)

and FIG. 4 reveals that they are the same except that methyl radicals are replaced by ethyl radicals.

In this embodiment, the HMO film comprises Si—O bonds, Si—$C_2H_5$ bonds, and Si—H bonds. Also in this embodiment, the molecular structure includes Si—H bonds which are absent in the conventional film. This means that some of Si—$C_2H_5$ bonds in the organic SOG film are replaced by Si—H bonds. Therefore, a reduction in density equivalent to that in the conventional case is obtained even with a smaller amount of Si—$C_2H_5$ bonds. That is, the dielectric constant can be reduced as much as in the conventional case, even with Si—$C_2H_5$ bonds mixed at a low concentration.

Fourth Embodiment

While in the first embodiment methyl silane is used as a reactive gas, in the fourth embodiment vinylsilane ($SiH_3$(CH=$CH_2$)) is used.

When vinylsilane is used, a silicon oxide film can be formed by reactions similar to those according to the above-mentioned chemical formulae (3-1) to (3-3) and (4). In this case, chemical reaction formulae are as follows:

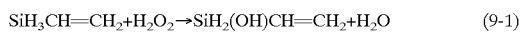

$SiH_3CH=CH_2+H_2O_2 \rightarrow SiH_2(OH)CH=CH_2+H_2O$ \hfill (9-1)

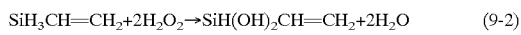

$SiH_3CH=CH_2+2H_2O_2 \rightarrow SiH(OH)_2CH=CH_2+2H_2O$ \hfill (9-2)

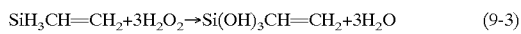

$SiH_3CH=CH_2+3H_2O_2 \rightarrow Si(OH)_3CH=CH_2+3H_2O$ \hfill (9-3)

$nSiH(OH)_2CH=CH_2 \rightarrow nSiOH(CH=CH_2)+nH_2O$ \hfill (10)

Figure 6:
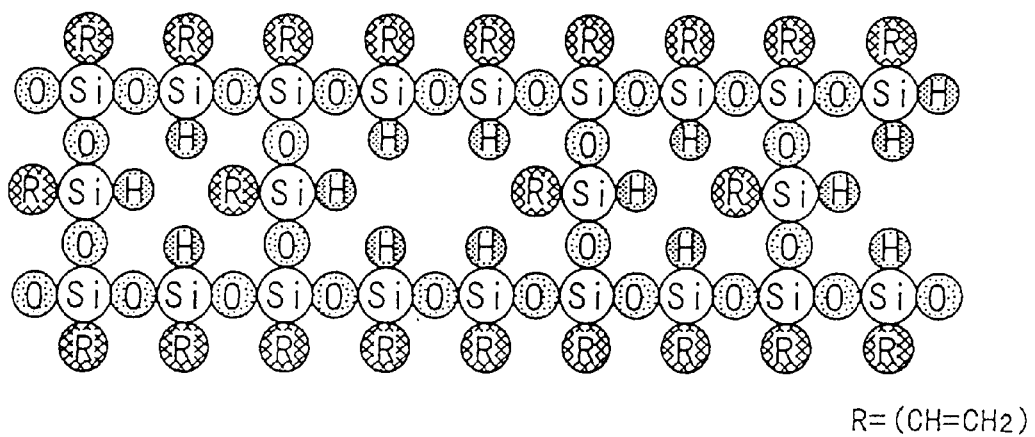
FIG. 6 schematically shows the molecular structure of a silicon oxide film formed according to a fourth embodiment of the invention in which vinylsilane is used as a source gas.
Figure 7A:
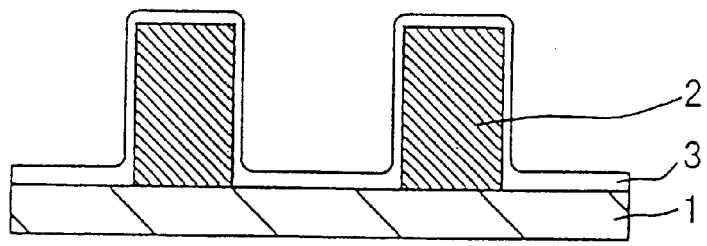
FIG. 7(a)–FIG. 7(c) show a conventional flow for forming an interlayer insulating film.
Figure 7B:
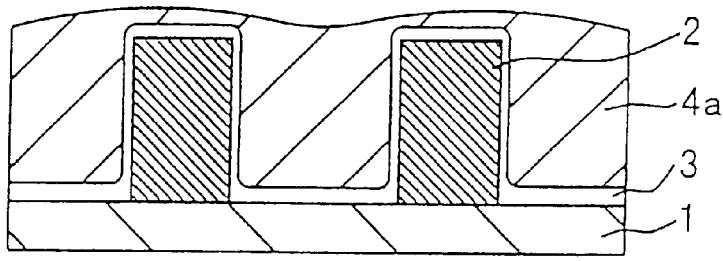
Figure 7C:
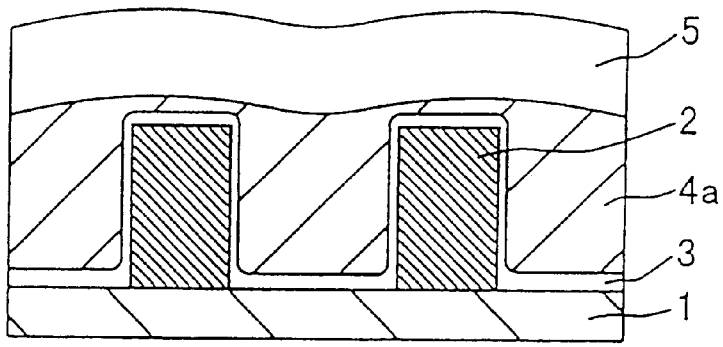

FIG. 6 shows the molecular structure of a silicon oxide film according to this embodiment. A comparison between the molecular structures of FIG. 2 and FIG. 6 reveals that they are the same except that methyl radicals are replaced by vinyl radicals.

In this embodiment, the HMO film comprises Si—O bonds, Si—CH=$CH_2$ bonds, and Si—H bonds. Also in this embodiment, the molecular structure includes Si—H bonds which are absent in the conventional film. This means that some of Si—CH=$CH_2$ bonds in the organic SOG film are replaced by Si—H bonds. Therefore, a reduction in density, equivalent to that in the conventional case, can be obtained even with a smaller amount of Si—CH=$CH_2$ bonds. That is, the dielectric constant can be reduced as much as in the conventional case even with Si—CH=$CH_2$ bonds mixed at a low concentration.

In each of the above embodiments, methyl silane, ethylsilane, or vinylsilane is used as a reactive gas respectively. From the viewpoint of the physical or chemical structure of films, the film density should decrease, in terms of the reaction gas used, in order of methylsilane, ethylsilane, and vinylsilane. The relative dielectric constant decreases in the same order.

Where a mixed gas of monomethylsilane and dimethylsilane is used, the resulting film is doped with a larger amount of organic radicals than in the case of using monomethylsilane singly, so that the relative dielectric constant is smaller though the effect of preventing a poisoned via is lower. The same applies to a comparison between the cases of using a mixed gas of monethylsilane and diethylsilane and using monoethylsilane singly.

A proper reaction gas or reactive gas mixture may be selected or formulated for a particular intended use of a film in view of the above facts.

As described above, according to the present invention, an interlayer insulating film of a semiconductor device is formed by using a material in which silicon atoms are main elements, each of the silicon atoms has an oxygen bond and a carbon bond, and at least some of the silicon atoms have a hydrogen bond. The carbon bond is a bond with one of a methyl radical, an ethyl radical, and a vinyl radical.

As a result, the molecular structure includes Si—H bonds which are absent in conventional interlayer insulating films. This means that part of Si—C bonds in the conventional films are replaced by Si—H bonds. Therefore, a reduction in density equivalent to that in the conventional case can be obtained even with a smaller amount of Si—C bonds, thereby enabling a smaller dielectric constant.

In the manufacturing method of a semiconductor device according to the present invention, an interlayer insulating film is formed by chemical vapor deposition. A mixed gas of hydrogen peroxide and a reactive gas having a gas molecular structure in which silicon atoms have a hydrogen bond and a carbon bond so that the interlayer insulating film has silicon atoms as main elements is used, each of the silicon atoms has an oxygen bond and a carbon bond, and at least some of the silicon atoms have a hydrogen bond.

Organic silane is used as the reactive gas. More specifically, organic silane has, as the main component, one or a mixture of methyl silane, ethylsilane, and vinylsilane.

The inventive manufacturing method enables formation of an interlayer insulating film of the above-mentioned type having a low density and a small relative dielectric constant as well as a semiconductor device, having such an interlayer insulating film.

Obviously many modifications and variations of the present invention are possible in the light of the above teachings. It is therefore to be understood that within the scope of the appended claims the invention may by practiced otherwise than as specifically described.

What is claimed is:

1. A semiconductor device comprising an interlayer insulating film that is made of a material having silicon atoms as main elements, substantially each of said silicon atoms having at least an oxygen bond and a carbon bond, at least some of said silicon atoms having a hydrogen bond, wherein said interlayer insulating film degasses less water than a film comprising silicon atoms having oxygen and methyl bonds.

2. The semiconductor device according to claim 1, wherein said carbon bond is a bond with either a methyl radical, an ethyl radical, or a vinyl radical.

3. A semiconductor device according to claim 1, wherein said carbon bond in the interlayer insulating film is a bond with a vinyl radical.

4. A semiconductor device comprising an interlayer insulating film that is made of a material having silicon atoms as main elements, substantially each of said silicon atoms having at least an oxygen bond and a carbon bond, at least some of said silicon atoms having a hydrogen bond, wherein said insulating film is deposited by chemical vapor deposition.

5. A semiconductor device according to claim 4, wherein the chemical vapor deposition comprises mixing a gas of hydrogen peroxide with an organic silane gas.

6. The semiconductor device according to claim 5, wherein said insulating film is formed at a temperature of −20° C. to 20° C., a pressure of 500 to 2000 mTorr and a gas flow of 40 to 200 SCCM for the organic silane and a gas flow of 0.4 to 0.9 g/min for the hydrogen peroxide.

7. A semiconductor according to claim 4, wherein said carbon bond is a bond to a vinyl radical.

* * * * *